(12) United States Patent
Hiraiwa et al.

(10) Patent No.: US 7,418,020 B2
(45) Date of Patent: Aug. 26, 2008

(54) SURFACE EMITTING LASER DEVICE

(75) Inventors: Koji Hiraiwa, Tokyo (JP); Takeo Kageyama, Tokyo (JP); Norihiro Iwai, Tokyo (JP); Keishi Takaki, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 11/554,973

(22) Filed: Oct. 31, 2006

(65) Prior Publication Data
US 2007/0110115 A1 May 17, 2007

(30) Foreign Application Priority Data
Oct. 31, 2005 (JP) ............... 2005-316946
Oct. 25, 2006 (JP) ............... 2006-290223

(51) Int. Cl.
*H01S 5/00* (2006.01)

(52) U.S. Cl. ............... 372/50.124; 372/50.11
(58) Field of Classification Search ............ 372/50.124, 372/43.01, 45.01, 46.013, 46.014, 50.1, 50.11, 372/54
See application file for complete search history.

(56) References Cited

U.S. PATENT DOCUMENTS

| 4,670,355 A | * | 6/1987 | Matsudaira | ............... 428/690 |
| 4,962,985 A | * | 10/1990 | LeGrange | ............... 385/14 |
| 2006/0013276 A1 | * | 1/2006 | McHugo | ............... 372/50.124 |

FOREIGN PATENT DOCUMENTS

| JP | 2000-68604 | | 3/2000 |
| JP | 2000-068604 | * | 3/2000 |
| JP | 2003-69150 | | 3/2003 |

OTHER PUBLICATIONS

U.S. Appl. No. 11/551,101, filed Oct. 19, 2006, Tanabe et al.

* cited by examiner

*Primary Examiner*—Armando Rodriguez
(74) *Attorney, Agent, or Firm*—Oblon, Spivak, McClelland, Maier & Neustadt, P.C.

(57) ABSTRACT

A VCSEL device includes a polyimide having a larger thickness (d1) on the surface of a semiconductor layer structure in a peripheral area 54, which is separated from a mesapost by an annular groove 52. The top surface of the central mesapost 30 is located at a lower position compared to the top surface of the peripheral area 54. A structure is obtained wherein the mesapost is not contacted by a jig or probe during handling the device in the test or assembly thereof.

12 Claims, 8 Drawing Sheets

Fig. 11
(a) 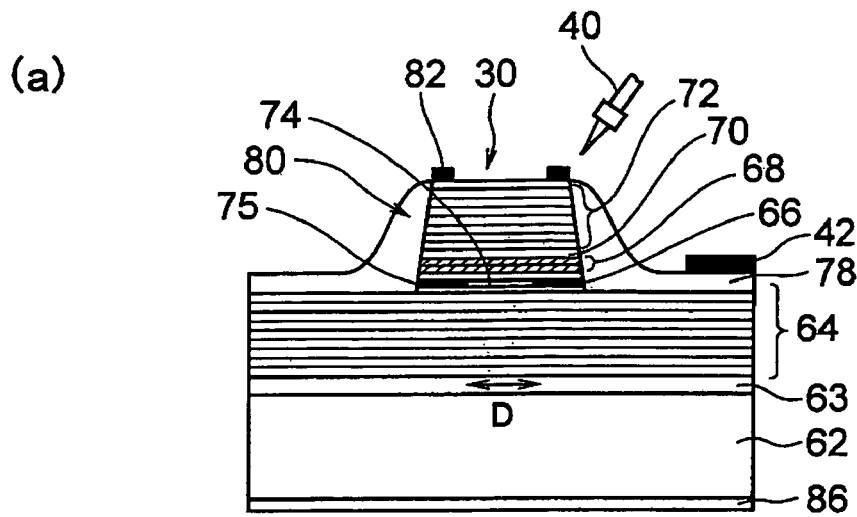
(b) 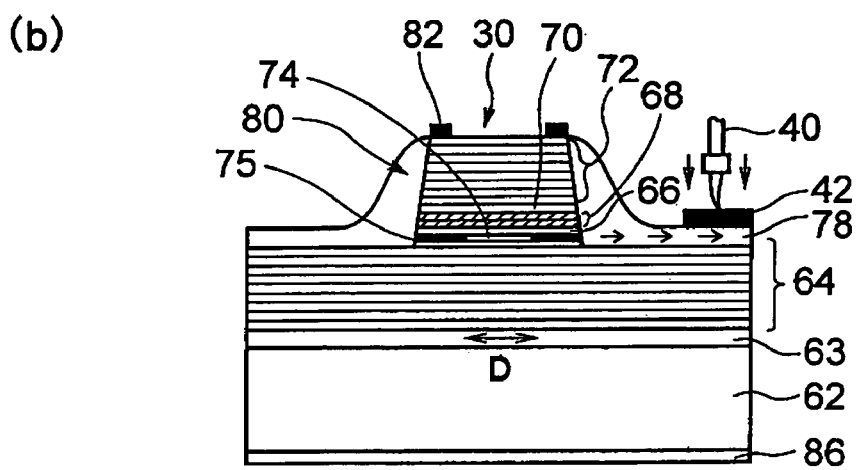
(c) 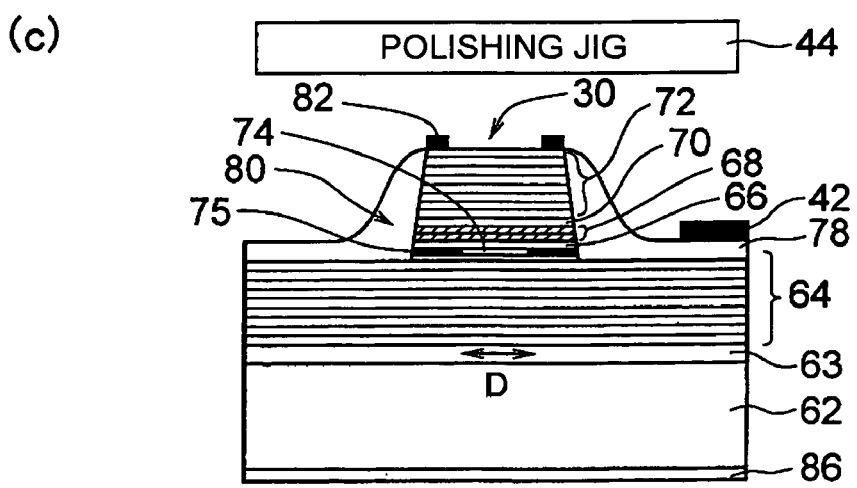

SURFACE EMITTING LASER DEVICE

FIELD OF THE INVENTION

The present invention relates to a surface-emitting laser device having a mesapost and a resonator structure normal to the substrate surface and, more particularly, to a surface-emitting laser device having a superior reliability.

BACKGROUND ART

Vertical-cavity surface-emitting laser (VCSEL which is referred to as simply surface-emitting laser device or VCSEL device hereinafter) is a semiconductor laser device which emits laser in the direction perpendicular to the substrate surface thereof. The surface-emitting laser device is such that a large number of VCSEL devices can be arranged in a two-dimensional array on a common substrate, and now attracts an attention as a light source in the field of communication as well as a specific device for a variety of applications.

The VCSEL device has a resonator structure, wherein a pair of semiconductor distributed-Brag-reflector mirrors (DBR mirrors) are formed on a semiconductor substrate such as GaAs or InP, and an active layer configuring an emission region is provided between the pair of DBR mirrors. For example, a GaAs-group VCSEL device can be formed on a GaAs substrate, and AlGaAs-based DBR mirrors (such as including AlAs/AlGaAs layer pairs) having an excellent heat conductivity and a higher reflectance can be used. Thus, the GaAs-group VCSEL device is expected as a promising laser device emitting a light having a wavelength range between 0.8 μm and 1.0 μm. In addition, a VCSEL device including an active layer configured by GaInNAs-based materials is expected as a promising laser device which emits laser of a longer wavelength range between 1.2 μm and 1.6 μm.

As a VCSEL device, an oxide-confinement-type surface-emitting semiconductor laser device is proposed which has a structure wherein an Al-oxidized layer confines the current injection area for improving the current efficiency and reducing the threshold current thereof.

With reference to FIG. 10, the configuration of a conventional surface-emitting semiconductor laser device used in a 850-nm-wavelength range and having an oxide-layer-confinement structure will be described hereinafter. FIG. 10 is a perspective sectional view depicting the configuration of the conventional 850-nm-range surface-emitting semiconductor laser device having the oxide-layer-confinement structure. The surface-emitting semiconductor laser device 100 has on a p-type GaAs (p-GaAs) substrate 62, a layer structure including a buffer layer 63, a bottom DBR mirror 64 including 35 pairs of p-$Al_{0.9}$GaAs/p-$Al_{0.2}$GaAs layers each having a layer thickness corresponding to λ/4n (λ and n are emission wavelength and refractive index, respectively), a lower cladding layer 66, a quantum-well active layer 68, an upper cladding layer 70, and a top DBR mirror 72 having 25 pairs of n-$Al_{0.9}$GaAs/n-$Al_{0.2}$GaAs layers each having a layer thickness corresponding to λ/4 n.

In the bottom DBR mirror 64, one of the $Al_{0.9}$GaAs layers disposed in the vicinity of the quantum-well active layer 68 is replaced by an AlAs layer 74, and the Al in an area of the AlAs layer 74 other than the central current-injection area thereof is selectively oxidized to configure an Al-oxidized layer 75 as the current-confinement layer. A part of the layer structure disposed between the top portion thereof and a portion of the bottom DBR mirror is configured as a mesapost 80, on which a ring electrode 82 is formed. The conventional VCSEL device 10A having the above structure is manufactured by a process as described below.

First, semiconductor layers configuring the layer structure are deposited using an epitaxial-growth technique.

Subsequently, a portion of the layer structure disposed between the top DBR mirror 72 and a portion of the bottom DBR mirror 64 is subjected to an etching treatment using a photolithographic and etching process, to configure a cylindrical mesapost 80 having a diameter of 30 μm, for example. In the step of forming the mesapost 80, a configuration may be employed wherein a semiconductor layer portion other than the mesapost 80 is removed by etching in its entirety, or an annular groove is formed by the etching to configure the mesapost inside the annular groove and a peripheral area surrounding the annular groove. The example shown in the figure is such that the portion of the semiconductor layers other than the mesapost 80 is removed by etching in its entirety.

An oxidation process is conducted wherein the layer structure configured as the mesapost 80 is maintained in a steam atmosphere at a temperature of about 400 degrees C., to thereby selectively oxidize the Al in the AlAs layer 74 from outside of the mesapost 80, whereby a current confinement layer including the Al-oxidized layer 75 is formed within the AlAs layer 74.

Subsequently, a SiNx passivation layer 76 is formed over the entire area of the wafer including the top surface and side surface of the mesapost 80 and a portion of the p-type bottom DBR mirror 64 near the mesapost 80. Thereafter, a polyimide film 78 is formed on the entire area of the wafer by coating, followed by curing the polyimide film 78 in a three-step heat treatment wherein temperatures of 200 degrees C., 300 degrees C. and 400 degrees C. are maintained for 40 minutes, 60 minutes and 60 minutes, respectively. Subsequently, a photolithographic process is conducted to remove a portion of the polyimide film 78 on the top surface of the mesapost 80, thereby exposing the SiNx passivation layer 76. The polyimide film 78, which is formed by coating to have a substantially uniform thickness, is subjected to the influence by the contraction etc. of the polyimide due to the post-coating heat treatment, thereby assuming a shape wherein the polyimide film is highest at the mesapost area and gradually reduces the height in the peripheral portion.

Subsequently, an RIE system is used to etch a portion of the SiNx passivation layer 76 exposed on the mesapost 80 by using CF gas as an etching gas, thereby forming a window for forming therethrough an n-side electrode. Thereafter, a metallic film is formed by evaporation to form a ring-shaped n-side electrode 82. After forming the n-side electrode 82, the bottom surface of the p-GaAs substrate 62 is polished to adjust the substrate thickness to 200 μm, followed by forming a metallic film on the bottom surface of the substrate by evaporation to form a p-side electrode 86. Subsequently, an electrode anneal is conducted at an anneal temperature of 400 degrees C for 3 minutes. After those steps as recited above, the wafer process is finished. Subsequently, the wafer is subjected to dicing using a dicing machine to formulate devices, whereby surface-emitting semiconductor laser devices 10A such as shown in FIG. 10 can be obtained. Those devices manufactured in the manner as described above are subjected to measurement tests such as for electric characteristics thereof, and mounted on an optical module etc. after the assembly steps. Conventional VCSEL devices are described in JP-2003-69150 A1 and JP-2000-68604 A1, for example.

As described above, the VCSEL device is embedded within the polyimide film in its entirety, and then subjected to the polishing process for the bottom surface of the substrate, testing process and assembly process, after the portion of the polyimide film on the top surface of the mesapost is removed. In those processes, handling of the VCSEL device causes a contact with respect to a variety of testing equipments and jigs, or applies a mechanical pressure etc. thereon.

In the testing process, as shown in FIG. 11(a), a measurement probe 40 is shifted on the surface of the wafer on which the mesapost 80 is formed, in order to contact the measurement probe 40 with the ring electrode 82 of the VCSEL device. Thus, the measurement probe 40 is likely to contact the mesapost 80. In addition, as shown in FIG. 11(b), if the measurement probe 40 contacts the pad electrodes 42 which is formed on the polyimide film 78 in the peripheral area outside the mesapost 80 and electrically connected to the ring electrode 82, a stress caused by the measurement probe 40 is applied to the mesapost 80 through the polyimide film 78.

During the polishing process for the bottom surface of the substrate, as shown in FIG. 11(c), a portion of the top surface of the mesapost 80 of the VCSEL device is attached onto a polishing jig 44, and the polishing is performed in this state. In this case, the attachment of the polishing jig 44 onto the portion configured by the bay window of the mesapost 80 for emitting therethrough the laser beam is likely to cause a defect on the mesapost 80. In the assembly process to the optical module, the VCSEL device is likely to contact an optical fiber on the top surface of the mesapost upon coupling thereof to the optical fiber. Further, before and after the testing process or assembly process, the VCSEL device is likely to be damaged also by a jig such as a pincette upon holding the same by the jig.

As described above, there is a problem in the process for handling the VCSEL device that the mesapost 80 of the VCSEL device is likely to be damaged on the surface of the mesapost 80 by a contact with respect to a variety of testing equipments or jigs due to a protruding structure thereof protruding from the peripheral area, or that the VCSEL device is damaged on the mesapost 80 having therein the resonator structure due to a stress applied thereto.

SUMMARY OF THE INVENTION

In view of the above, it is an object of the present invention to improve the conventional VCSEL device having a mesapost and thereby provide a VCSEL device having a structure which is not likely to be mechanically damaged during the testing process or assembly process thereof on the mesapost having therein a resonator structure.

The present invention provides, in a first aspect thereof, a VCSEL device comprising a layer structure including a top DBR mirror, a bottom DBR mirror and an active layer interposed between said top DBR mirror and said bottom DBR mirror, a layer portion of said layer structure which includes at least said active layer being configured as a mesapost, wherein:

a top surface of a dielectric film formed in a peripheral area disposed outside said mesapost is located at a higher position compared to a top surface of said mesapost.

The present invention provides, in a second aspect thereof, a VCSEL device comprising a layer structure including a top DBR mirror, a bottom DBR mirror and an active layer interposed between said top DBR mirror and said bottom DBR mirror, a layer portion of said layer structure which includes at least said active layer being configured as a mesapost, a top surface of said mesapost having a mesapost terminal, said VCSEL device further comprising:

a pad terminal formed on a surface of a peripheral area disposed outside said mesapost and electrically connected to said mesapost terminal, a surface of said pad terminal being located at a higher position compared to said mesapost terminal.

Here, "a higher location" means a location which is apart from the substrate on which the VCSEL device is formed by a larger distance.

In accordance with the VCSEL device of the present invention, employment of the configuration wherein the surface of the peripheral area is located higher than the top surface of the mesapost prevents the testing equipment or handling jig from contacting with the mesapost or applying a pressure to the mesapost to thereby damage the mesapost, during handling the VCSEL device in the polishing process, testing process or assembly process for the VCSEL device. Accordingly, a VCSEL device having a superior reliability can be provided.

BRIEF DESCRIPTION OF THE DRAWINGS

FIG. 11 is a view for explaining problems encountered in the polishing process and testing process for the conventional VCSEL device.

BEST MODES FOR IMPLEMENTING THE INVENTION

The VCSEL device of the present invention features in the first aspect that the top surface of the dielectric film formed in the peripheral area disposed outside the mesapost is located at a higher position compared to the top surface of the mesapost. The VCSEL device features in the second aspect thereof that the VCSEL device has a pad terminal formed on the surface of the peripheral area disposed outside the mesapost and electrically connected to the said mesapost terminal, wherein the surface of the pad terminal is located at a higher position compared to the mesapost terminal.

The VCSEL device of the present invention is applicable to the structure wherein an annular groove is formed between the mesapost and the layer portion of the peripheral area, the annular groove having a side surface configuring a side surface of the layer portion of the mesapost.

It is a preferable embodiment of the present invention that the dielectric film has a thickness of d2 in an area between the top surface of the mesapost and the layer portion of the peripheral area, a maximum thickness of the dielectric film in the peripheral area is d1, and the following relationship $0 \leq d2 < d1$ holds. In this case, an external stress applied to the peripheral area is reduced during transferring to the mesapost via the dielectric film, thereby protecting the mesapost against the external force.

In the above case, if employed, it is also preferable that the dielectric film have a thickness of d3 in another area between the area in which the dielectric film has the thickness of d2 and the top surface of the mesapost, and the following relationship $0 \leq d2 < d3$ holds. In this case, the portion of the dielectric film having a larger thickness of d3 protects the sidewall etc. of the mesapost against the external force.

The dielectric film may be made of an organic resin, for example, made of polyimide. In an alternative, the dielectric film may be made of SixN or SixOy. These different dielectric films may be layered one on another.

The top DBR mirror may be a dielectric DBR mirror. In this case, a film configuring the dielectric DBR mirror may cover the entire mesapost and configure a dielectric film formed in the peripheral area, or the dielectric film may cover the peripheral area.

Instead of the configuration wherein the VCSEL device is connected to an external electrode at the position of the ring electrode, a pad terminal connected to the ring electrode is formed in the peripheral area, and the pad electrode and external electrode area connected together. In this case, the contact or pressure occurring during connecting the VCSEL device to the external terminal is reduced. The pad terminal may be preferably formed on the dielectric film covering the peripheral area.

Hereinafter, embodiments of the present invention will be described concretely in detail with reference to accompanying drawings while exemplifying the embodiments.

EMBODIMENT 1

Figure 1:
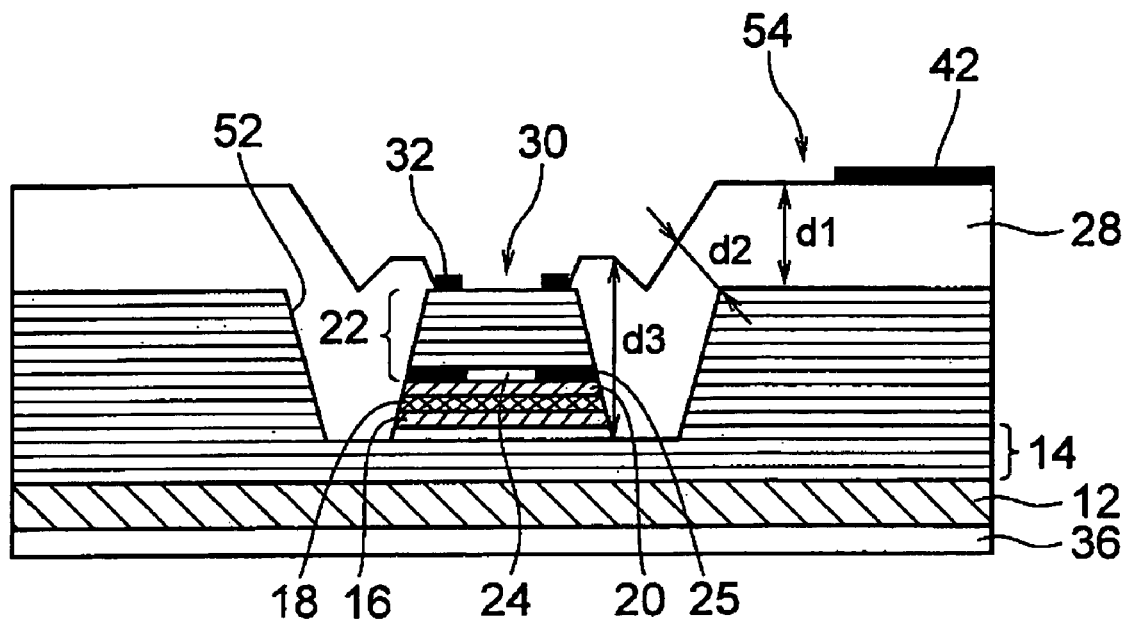
FIG. 1 is sectional view of a VCSEL device according to a first embodiment of the present invention.

FIG. 1 shows a VCSEL device according to a first embodiment of the present invention. In the VCSEL device 10 shown in FIG. 1, the layer structure is formed on an n-type substrate, differently from the conventional VCSEL device 10A wherein the layer structure is formed on a p-type substrate. More specifically, the VCSEL device 10 of the present embodiment has, on an n-GaAs substrate 12, a semiconductor layer structure including: an n-type bottom DBR mirror including 35 n-$Al_{0.9}$GaAs/n-$Al_{0.2}$GaAs layer pairs each having a thickness of λ/4 n in each layer; a lower cladding layer 16, a quantum-well active layer 18; an upper cladding layer 20, a confinement oxide layer comprised of AlAs layer 24 and Al-oxide layer 25; and a p-type top DBR mirror 22 including 25 p-$Al_{0.9}$GaAs/p-$Al_{0.2}$GaAs layer pairs each having a thickness of λ/4 n in each layer.

The central portion on the substrate surface is configured as a mesapost 30. The mesapost 30 is separated from the peripheral area 54 by an annular groove which is formed in the layer structure while extending from the top surface of the layer structure to a portion of the bottom DBR mirror. The width of the annular groove 52 is around 5.0 to 30 μm, whereas the height of the mesapost 54 or the depth of the annular groove 52 is around 3 to 7 μm. A polyimide film 28 is formed on the semiconductor layer structure in the peripheral area 54, wherein the layer structure of the mesapost 30 is different from the layer structure of the peripheral area 54 only in the structure of the polyimide film 28.

In the VCSEL device 10 having the above structure, the semiconductor layer structure is deposited similarly to the conventional fabrication method except for the difference between the n-type and the p-type. After deposition of the semiconductor layers, the annular groove 52 is formed extending from the layer surface to a portion of the bottom DBR mirror 14 by using a photolithographic and etching process, thereby configuring the mesapost 30. The entire surface of the wafer on which the mesapost 30 is formed is coated with polyimide, which is subjected to a needed heat treatment to form a polyimide film 28. Thereafter, a photolithographic process is conducted to remove a portion of the polyimide film 28 in an area corresponding to at least top surface of the mesapost 30 and wider than the top surface of the mesapost 30. In this step, the polyimide film 28 has convex and concave portions thereon due to a difference in the amount of contraction thereof depending on the thickness of the polyimide film 28. This is likely to cause a protruding shape on the thin polyimide film 28 in a peripheral portion surrounding the top surface of the mesapost 30. In this case either, the height of the surface of the polyimide film 28 in the peripheral area 54 is higher than the mesapost 30 including the polyimide film 28. After the etch of the polyimide film 28, p-side electrode 32 and n-side electrode 36 area formed on the top surface of the mesapost 30 and the bottom surface of the substrate 12, respectively.

The pad electrode 42 disposed on the peripheral area 54 is located on a higher position compared to the position of the ring electrode 32 disposed on the mesapost 30. It is to be noted here that the "higher position" means a larger distance with respect to the surface of the substrate 12. The ring electrode 32 and pad electrode 42 are electrically connected together by an evaporated metallic film formed on the polyimide film 28, for example. Since the mesapost 30 is configured by formation of the annular groove 52 as described heretofore, the layers of the mesa post 30 and the layers of the peripheral area 54 outside the annular groove 52 have an equal height, whereby the structure wherein the top surface of the polyimide film 28 on the peripheral area 54 is higher than the top surface of the mesapost 30 can be easily obtained.

The structure wherein the VCSEL device has a mesapost 30 lower than the top surface of the polyimide film 28 reduces unnecessary contacts with respect to the probe or jig etc. during the testing process or working process such as the substrate polishing.

In the present embodiment, assuming that the maximum thickness of the polyimide film 28 on the surface of the peripheral area 54 is d1 as shown in FIG. 1, the thickness d2 of the polyimide film 28 in the vicinity of the outer sidewall of the annular groove 52 is smaller than d1. In addition, the thickness d2 is smaller than the thickness d3 of the polyimide film within the annular groove 52. More specifically, the polyimide film 28 is formed to have a large thickness d1 in the area from the peripheral area 54 toward the central mesapost 30, then a smaller thickness d2, and again a larger thickness d3 in the inner area due to an increase toward the inner area. In other word, the polyimide film 28 has a depressed portion sandwiched between both larger-thickness areas. Due to having such a depressed portion, the stress transferred to the mesapost 30 is reduced when the stress is applied to the polyimide film in the peripheral area 54. For example, the thickness d2 of the depressed portion of the polyimide film 28 is around 1 to 3 μm. The thickness d1 of the polyimide film 28 in the peripheral area 54 is around 4 to 10 μm. It is to be noted however that the surface of the polyimide film 28 having the thickness d1 in the peripheral area 54 is located on the higher position compared to the mesapost 30 irrespective of the larger thickness d3.

If the thickness d3 of the polyimide film 28 in the peripheral area is excessively small, it is impossible to provide a sufficient difference between the same and the thickness d2 of the depressed portion. In addition, if the depressed portion has an excessively larger thickness, it is impossible to sufficiently prevent the transfer of the stress. In the present invention, fabrication of such a structure is easily achieved if the vertical interval between the ring electrode 32 and the pad terminal 42 is relatively small and the conductor for communicating together the ring electrode 32 and the pad terminal 42 is formed as by evaporation.

Figure 2:
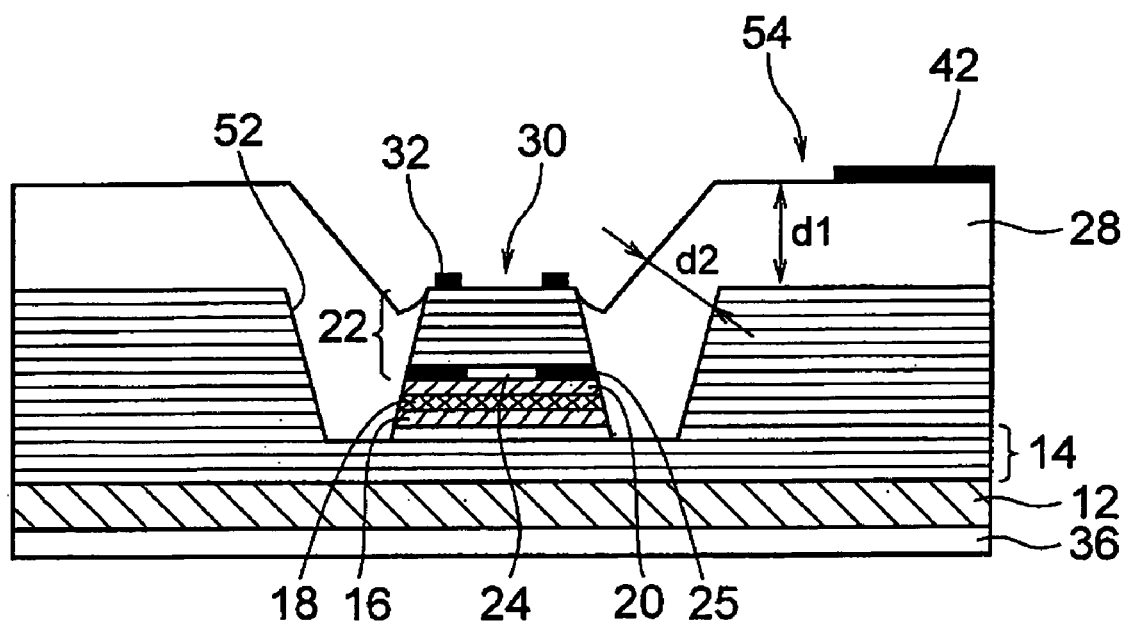
FIG. 2 is a sectional view of a first modified example modified from the VCSEL device of FIG. 1.

FIG. 2 shows a VCSEL device 10B according to a first modification of the above embodiment. In this modification exemplified, a portion of the polyimide film 28 overhanging the top surface of the mesapost 30 is removed. The other configurations are similar to those of the embodiment of FIG. 1.

Figure 3:
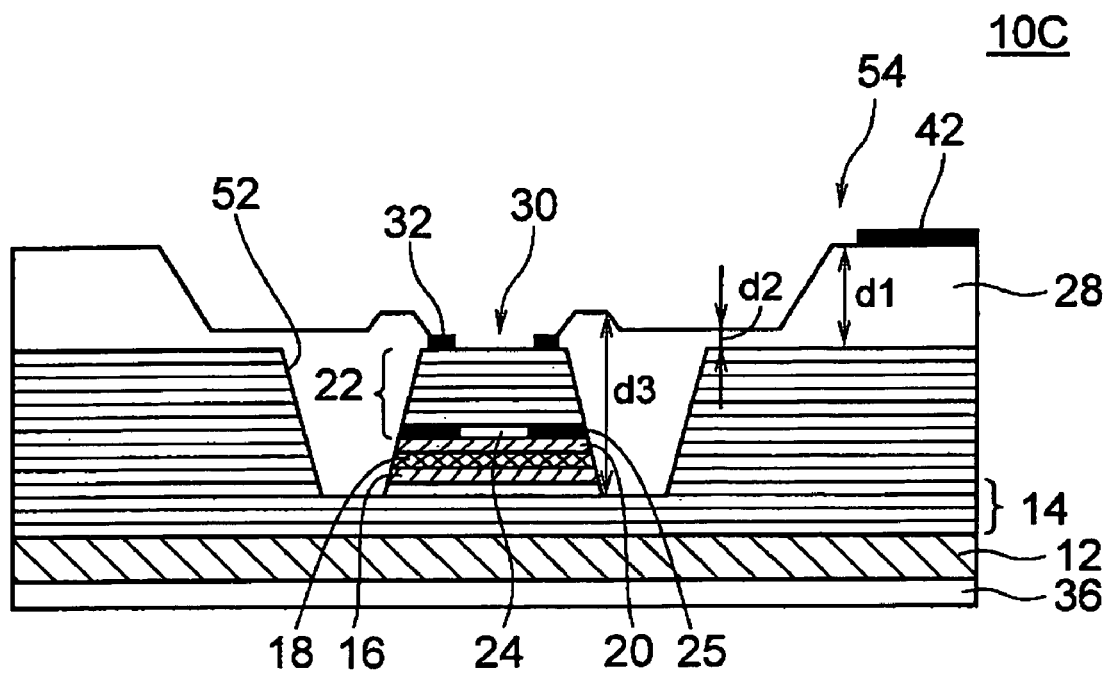
FIG. 3 is a sectional view of a second modified example modified from the VCSEL device of FIG. 1.

FIG. 3 shows a VCSEL device 10B according to a second modification of the above embodiment. In this modification exemplified, the depressed portion of the polyimide film 28 formed in the vicinity of the outer periphery of the annular groove 52 is replaced by an area of the polyimide film 28 having a small thickness d1 in the vicinity of the inner edge of the peripheral area 54 to thereby configure a depressed portion in the polyimide film 28. It is to be noted that d2 shown in FIG. 3 may be zero. The other configurations are similar to those in the embodiment of FIG. 1.

Figure 4:
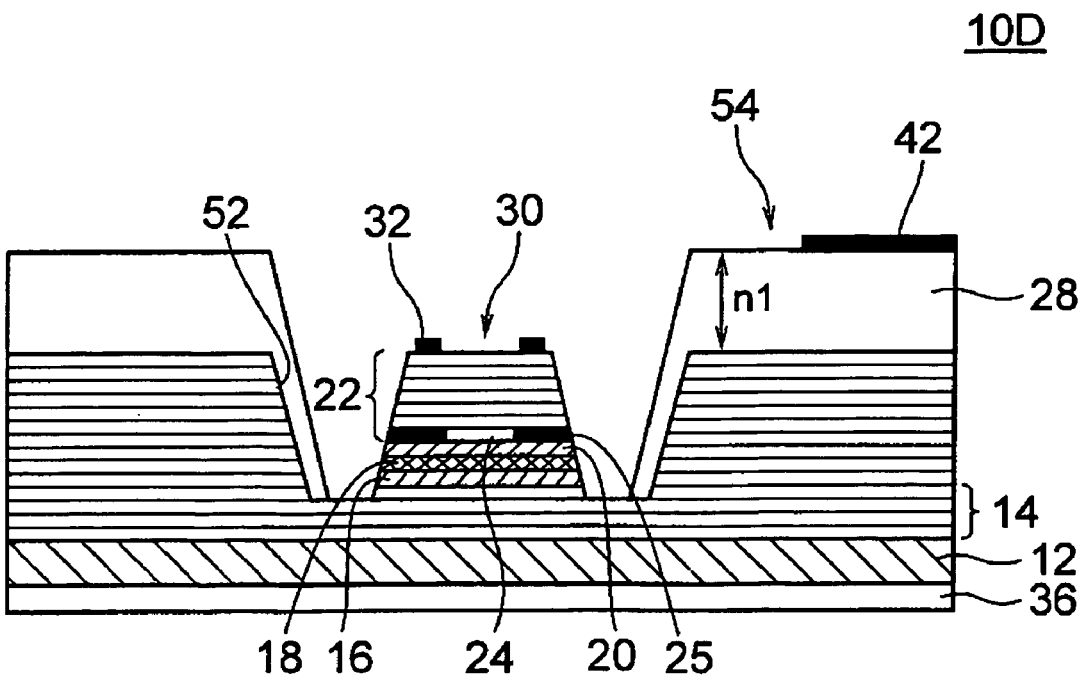
FIG. 4 is a sectional view of a third modified example modified from the VCSEL device of FIG. 1.

FIG. 4 shows a VCSEL device 10D according to a third modification of the embodiment of FIG. 1. In this modification exemplified, the polyimide film 28 is not formed on the top and side surfaces of the mesapost and most of the internal of the annular groove 52, and the polyimide film 28 is formed only in an outer portion of the annular groove 52.

Figure 5:
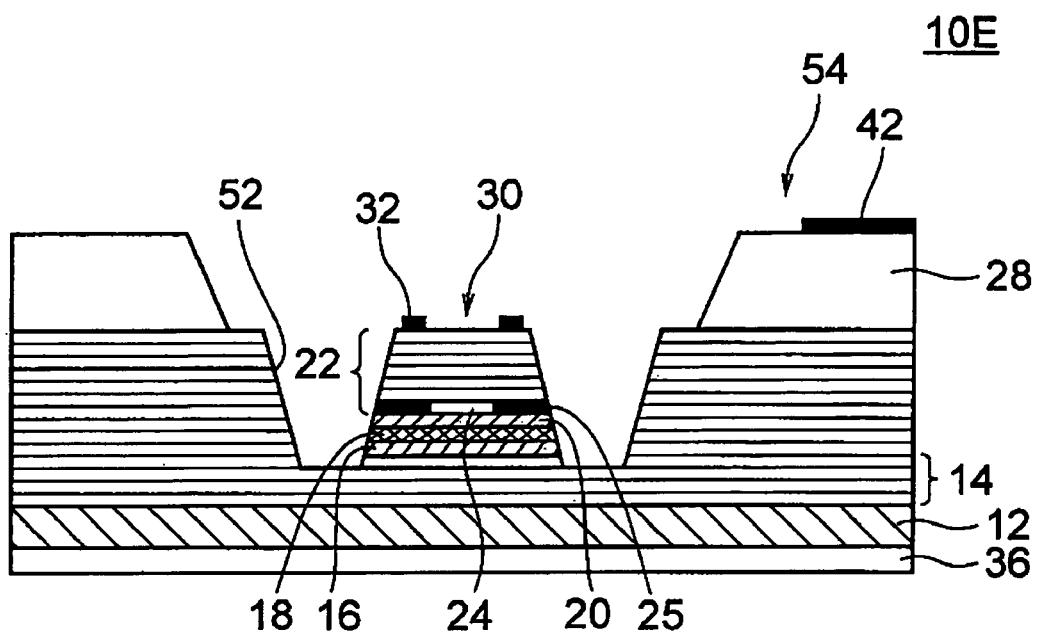
FIG. 5 is a sectional view of a fourth modified example modified from the VCSEL device of FIG. 1.

FIG. 5 shows a VCSEL device 10E according to a fourth modification of the embodiment of FIG. 1. In this modification exemplified, the polyimide film 28 is not formed on the top and side surfaces of the mesapost 30 and the internal of the annular groove 52, and there is an area in the vicinity of the inner edge of the peripheral area 54, the area being such that the polyimide film 28 is not formed therein.

In the VCSEL devices according to the embodiment of the present invention and the modification, the configuration is shown wherein the top surface of the peripheral area 54 is located at a higher position compared to the top surface of the mesapost 30 by using the polyimide film 28 as the dielectric film. However, the dielectric film is not limited to the polyimide film, and may be other dielectric materials, and a SixN film or SixOy film may be formed in the peripheral area to have a larger height compared to the mesapost.

EMBODIMENT 2

Figure 6:
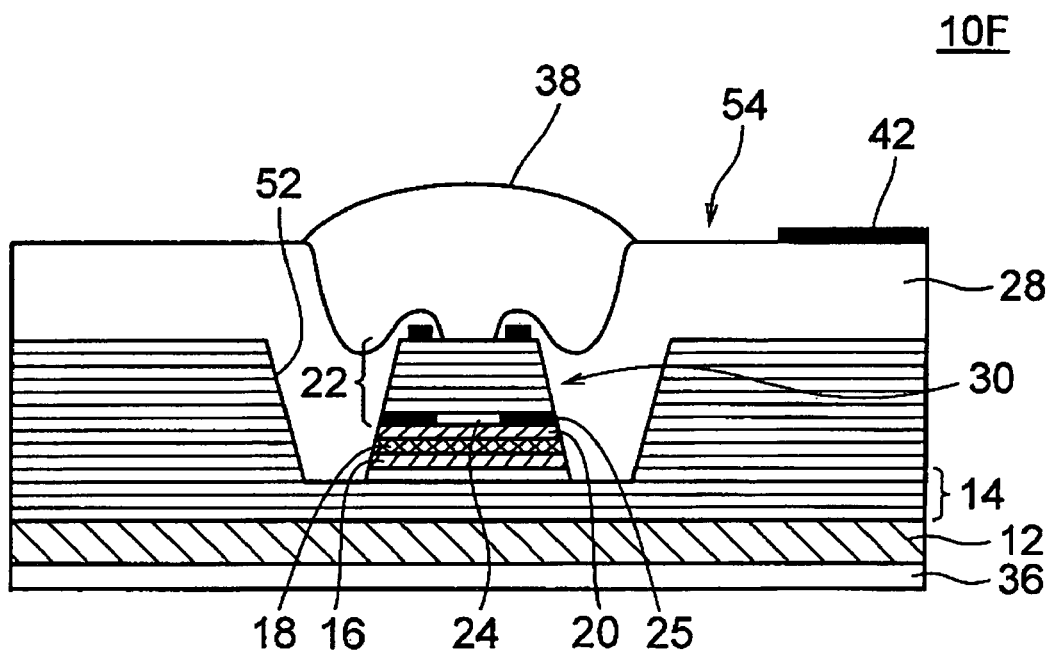
FIG. 6 is a sectional view of a VCSEL device according to a second embodiment of the present invention.

FIG. 6 shows a VCSEL device according to a second embodiment of the present invention. In the present embodiment, a resin lens 38 is formed on the top surface of the mesapost of the VCSEL device of the embodiment shown in FIG. 1. The resin lens 38 is formed on the surface of the polyimide film 28 overlying the mesapost 30 and the annular groove 52 by taking advantage of the depressed shape of the polyimide film 28, configuring a domed top surface. In the present embodiment, the size of the depressed portion of the polyimide film 28 is appropriately selected, to allow a suitable size of the resin lens 38 to be easily obtained, without the necessity of alignment of the VCSEL device with respect to the lens. In addition, formation of the resin lens 30 directly on the mesapost 30 allows the optical system, which optically couples the VCSEL device with an optical fiber, to be formed in a smaller size, and obtains a function of protecting the top surface of the mesapost 30 by the resin lens 30.

The structure of the VCSEL device of the present invention is applicable to a laser array, in which VCSEL devices are arranged in a two-dimensional array on a common substrate for integration. In particular, the configuration of the VCSEL device of the present invention reduces the damage incurred in the polishing process, testing process etc., thereby providing a higher reliability which is generally required for all the plurality of VCSEL devices integrated

EMBODIMENT 3

FIGS. 7(a) and (b) are side views respectively showing a VCSEL device 10G according to a third embodiment of the present invention and a laser array 50 wherein such VCSEL devices 10G are arranged in a two-dimensional array on a common substrate for integration. As depicted in FIG. 7(a), in the VCSEL device 10G of the present embodiment, the top DBR mirror is configured as a dielectric DBR mirror 46, and the entire surface of the mesapost 30 and dielectric film 28 is covered by a film configuring the dielectric DBR mirror 46 to obtain the structure.

On a semi-insulating substrate 13 is formed a bottom DBR mirror configured by semiconductor layers, on which an n-type lower cladding layer 56, active. layer 18 and a p-type semiconductor cladding layer 58 are formed, wherein these lower cladding layer 56, active layer 18 and upper cladding layer 58 are left as a layer portion in the peripheral area. A dielectric film 28 made of polyimide is formed to cover this layer portion in the peripheral area, and the dielectric film 28 is covered by a film configuring the dielectric DBR mirror 46. The surface of the peripheral area is formed to be higher than the top surface of the mesapost 30. The dielectric DBR mirror 46 is configured by a layer structure including a plurality of pairs each including an amorphous silicon and a silicon oxide in pair, or a layer structure including a plurality of pairs each including a silicon oxide film and a silicon nitride film in pair.

In the mesapost 30, an n-side electrode 36A is formed on a surface portion of the lower cladding layer 56, and is connected to the n-side pad electrode 48 formed on the film configuring the DBR mirror 46 in the peripheral area. Similarly, the p-side electrode 32 configuring the ring electrode is connected to the p-side electrode 42 formed on the film configuring the DBR mirror 46 in the peripheral area. These pad electrodes 42, 48 are made from an Au film, for example.

As shown in FIG. 7(b), a large number of VCSEL devices 10G having the above configuration are formed on a common substrate 12 to configure the laser array 50. Due to the peripheral area of the VCSEL devices being higher the mesapost 30, and also due to the dielectric DBR mirror 46 covering the entire device, damage applied to each of the laser devices is reduced during the polishing process, testing process etc.

EMBODIMENT 4

Figure 7:
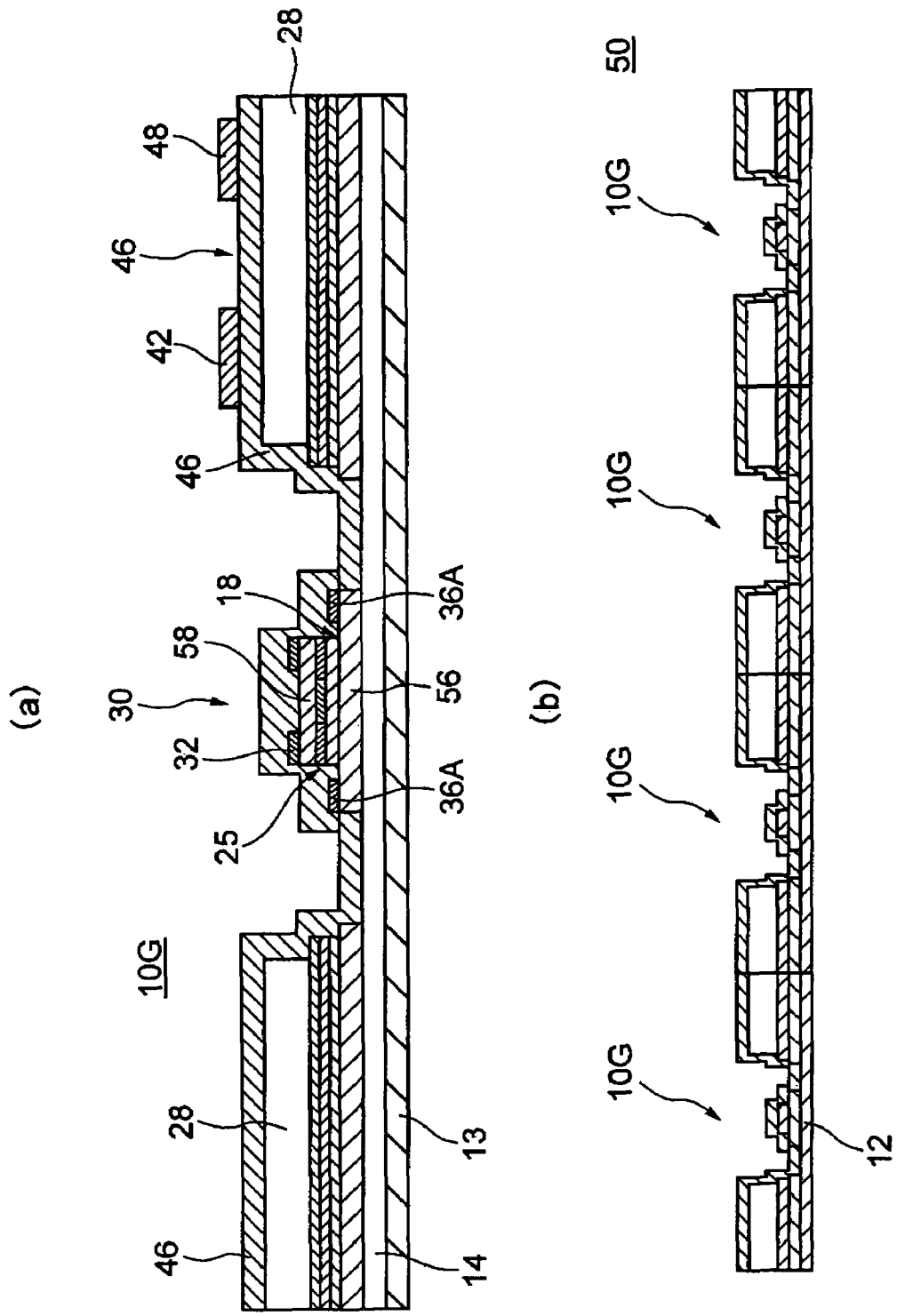
FIG. 7 is a sectional view of a VCSEL device and a laser array according to a third embodiment of the present invention.
Figure 8:
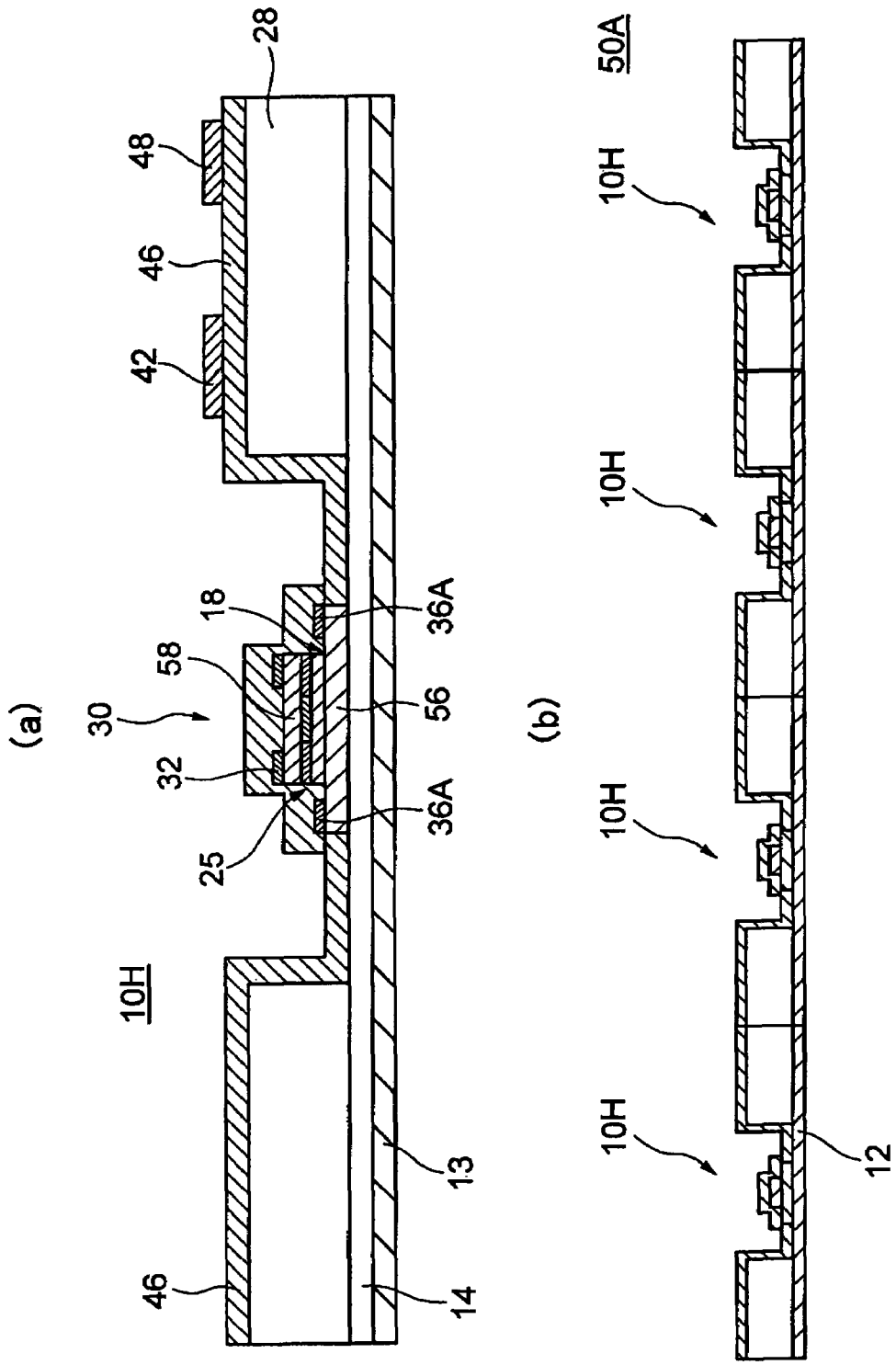
FIG. 8 is a sectional view of a VCSEL device and a laser array according to a fourth embodiment of the present invention.

FIG. 8 shows a VCSEL device 10H according to a fourth embodiment of the present invention and a laser array 50A, similarly to FIG. 7. The VCSEL device 10H of the present embodiment is different from the VCSEL device 10G of the third embodiment in that the layer portion of the peripheral area is entirely removed in the present embodiment. The dielectric film 28 such as polyimide is formed to have a larger thickness in the layer portion thus removed. The laser array 50A is such that a larger number of VCSEL devices having the above structure are disposed on a common substrate 12.

EMBODIMENT 5

Figure 9:
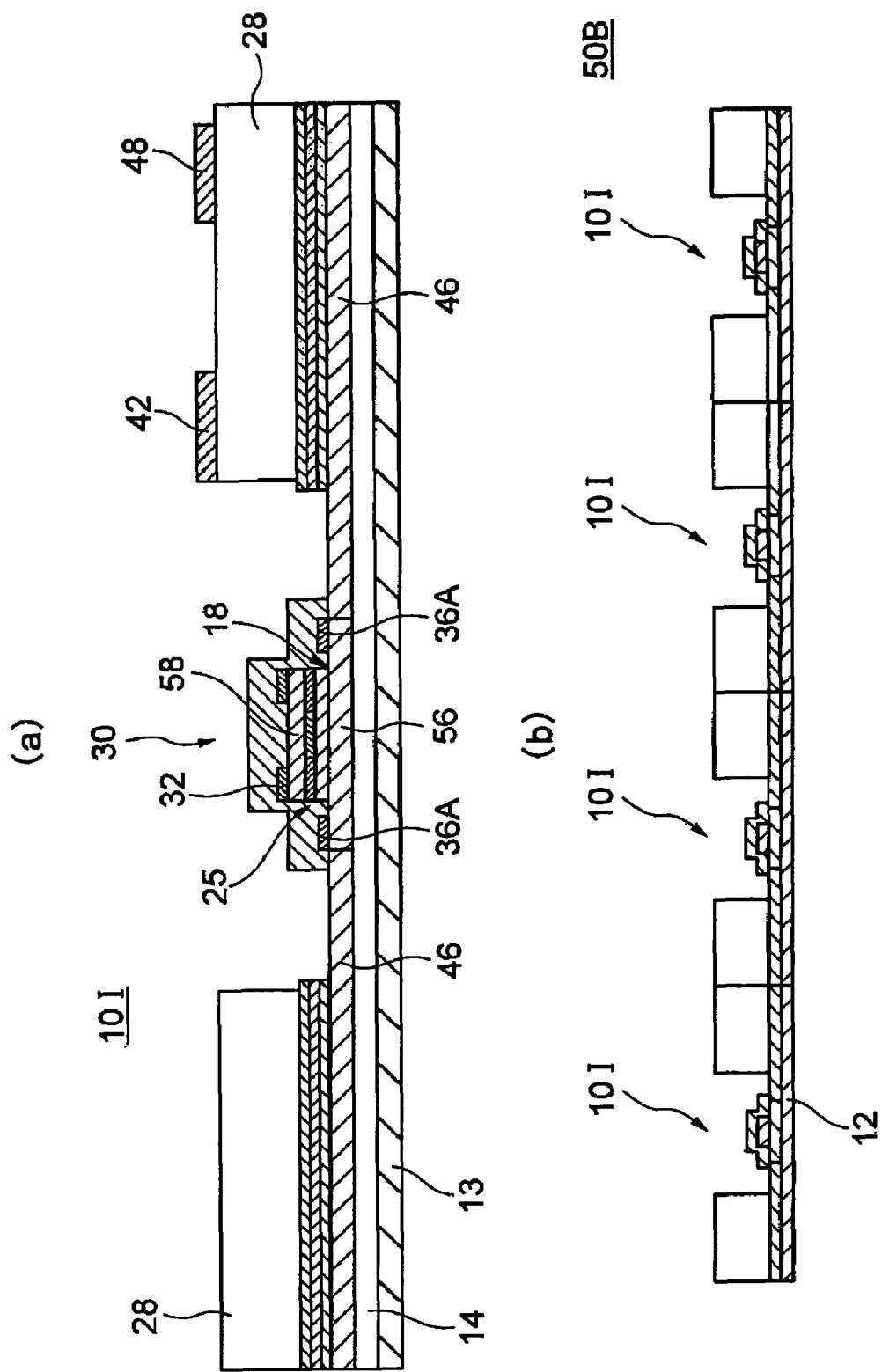
FIG. 9 is a sectional view of a VCSEL device and a laser array according to a fifth embodiment of the present invention.
Figure 10:
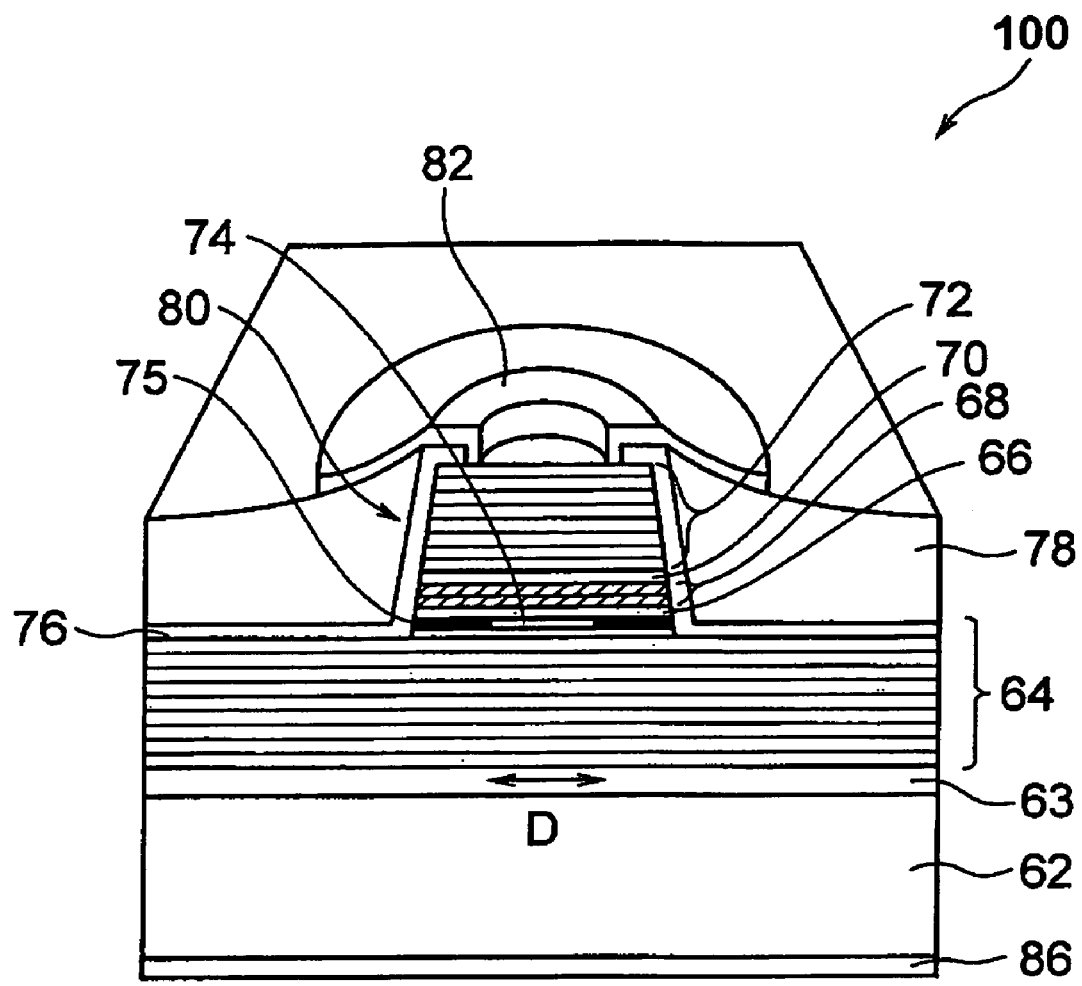
FIG. 10 is a perspective sectional view of a conventional VCSEL device.

FIG. 9 shows a VCSEL device 101 according to a fifth embodiment of the present invention and a laser array 50B, similarly to FIG. 7. The VCSEL device 10I of the present embodiment is different from the VCSEL device 10G of the embodiment shown in FIG. 8 in that the film configuring the dielectric DBR mirror 46 is covered by the dielectric film 28 such as polyimide formed in the peripheral area. The dielectric DBR mirror 46 is formed to cover the entire surface of the mesapost 30. The n-side pad electrode 48 and p-side pad electrode 42 are formed on a surface portion of the dielectric film 28.

It is to be noted that although VCSEL device and laser array formed on an n-type substrate are exemplified in the above embodiments, the substrate used may be any of n-type and p-type ones, and that the p-type and n-type are reversed from the above embodiments if the VCSEL device is formed on the p-type substrate.

Although the present invention is described with reference to the preferred embodiments, the VCSEL device of the present invention is not limited to the above embodiments, and a variety of modifications or alterations from the above embodiments will fall within the scope of the present invention.

What is claimed is:

1. A surface-emitting laser (VCSEL device) comprising:
a layer structure including a top DBR mirror, a bottom DBR mirror and an active layer interposed between said top DBR mirror and said bottom DBR mirror, a layer portion of said layer structure which includes at least said active layer being configured as a mesapost, said mesapost having thereon a mesapost terminal as a topmost layer,
wherein a top surface of a dielectric film formed in a peripheral area disposed outside said mesapost is located at a higher position compared to a top surface of said mesapost terminal.

2. The VCSEL device according to claim 1, wherein an annular groove is formed between said mesapost and a layer portion of said peripheral area, said annular groove having a side surface configuring a side surface of said layer portion of said mesapost.

3. The VCSEL device according to claim 2, wherein a portion of said dielectric film is formed on a portion of said top DBR disposed in said mesapost, and said dielectric film has a thickness of d2 in an area between said annular groove and said layer portion of said peripheral area, a maximum thickness of said dielectric film in said peripheral area is d1, the following relationship holds:

$$0 \leq d2 < d1.$$

4. The VCSEL device according to claim 3, wherein said dielectric film has a thickness of d3 in said annular groove, and the following relationship holds:

$$0 \leq d2 < d3.$$

5. The VCSEL device according to claim 1, wherein said layer portion in said peripheral area is removed.

6. The VCSEL device according to claim 1, wherein said dielectric film includes an organic resin.

7. The VCSEL device according to claim 6, wherein said dielectric film includes polyimide.

8. The VCSEL device according to claim 1, wherein said dielectric film includes SixN or SixOy.

9. The VCSEL device according to claim 1, wherein said top DBR mirror is a dielectric DBR mirror.

10. The VCSEL device according to claim 9, wherein a film configuring said dielectric DBR mirror covers said mesapost and configures said dielectric film formed in said peripheral area.

11. The VCSEL device according to claim 9, wherein a film configuring said dielectric DBR mirror covers said mesapost and is covered by said dielectric film in said peripheral area.

12. The VCSEL device according to claim 1, wherein said pad terminal is formed on a dielectric film covering at least said peripheral area.

* * * * *